(12) United States Patent
Chang

(10) Patent No.: US 7,931,714 B2
(45) Date of Patent: Apr. 26, 2011

(54) COMPOSITION USEFUL TO CHEMICAL MECHANICAL PLANARIZATION OF METAL

(75) Inventor: Songyuan Chang, Zhongli (TW)

(73) Assignee: UWIZ Technology Co., Ltd., Taoyuan County (TW)

( * ) Notice: Subject to any disclaimer, the term of this patent is extended or adjusted under 35 U.S.C. 154(b) by 593 days.

(21) Appl. No.: 11/868,577

(22) Filed: Oct. 8, 2007

(65) Prior Publication Data

US 2009/0090888 A1    Apr. 9, 2009

(51) Int. Cl.
*B24D 3/02* (2006.01)
*C09C 1/68* (2006.01)
*C09K 3/14* (2006.01)

(52) U.S. Cl. ............................... 51/307; 51/308; 51/309
(58) Field of Classification Search ......................... None
See application file for complete search history.

(56) References Cited

U.S. PATENT DOCUMENTS

| 6,248,144 | B1 * | 6/2001 | Tamai et al. | 51/308 |
| 7,319,072 | B2 * | 1/2008 | Kurata et al. | 438/690 |
| 2003/0219982 | A1 * | 11/2003 | Kurata et al. | 438/692 |
| 2004/0020135 | A1 * | 2/2004 | Tsuchiya et al. | 51/308 |

* cited by examiner

*Primary Examiner* — Duy-Vu N Deo
(74) *Attorney, Agent, or Firm* — Jianq Chyun IP Office

(57) ABSTRACT

A chemical mechanical polishing composition, the polishing composition includes polishing abrasive, an oxidizing agent, an accelerating compound, an inhibitor, a co-inhibitor, and a solvent as the remaining. The composition can maintain a high removal rate through polishing, meantime it has a feature to inhibit static etch rate and lower the defect of polishing including metal dishing and erosion. Hence it needs no change of the composition for simultaneously removing a most part of a metal layer, particularly for a first stage of polishing bulk copper layer and for a second micro-polishing stage of removing the remaining less copper; the present invention has the advantage of simplifying processing and reducing waste.

12 Claims, No Drawings

COMPOSITION USEFUL TO CHEMICAL MECHANICAL PLANARIZATION OF METAL

BACKGROUND OF THE INVENTION

1. Field of the invention

The present invention relates to a chemical mechanical polishing composition, and especially to a chemical mechanical composition suitable for metal polishing.

2. Description of the Prior Art

Following the tendency that critical dimensions of electronic elements get smaller and smaller and that layers of conductors required increase rapidly, electric resistance/capacitance time delay (RC Time Delay) will gravely influence the speed of operation of integrated circuits. In order to avoid time delay induced by reducing of the width of metallic wire and the problem on reliability of electron displacement, copper conductive material with low electric resistance and high ability of impedance against destruction of electron displacement is chosen in lieu of aluminum alloy. However, by the fact that the metallic copper has the character of being hard to be etched, another mode of damascening must be adopted for forming the metallic copper wire.

The so called damascening is that: a position for a copper wire is given by etching on a dielectric layer by the micro-patterning technique in the first place, then a copper film is formed by deposition on the dielectric layer to fill copper all over trenches on the dielectric layer, and at last, the copper film is removed by polishing using the technique of chemical mechanical polish (CMP), to leave copper in the trenches as metallic conductors. In the process of damascening, copper-chemical mechanical polish is a brand new technique, and has been the most important part in the metal damascening technique of copper conductors.

The chemical mechanical polishing mainly is to remove metal by polishing transversely; it works only when the mechanical and the chemical actions are used simultaneously; for metal being damascened in a dielectric layer, it has lower polish removal rate, so that copper wires embedded in the dielectric layer can be kept. However, in the technique of chemical mechanical polish for metal, the metal surface still often has the defects of metal dishing and erosion.

The phenomenon of metal dishing and erosion is highly in relation with the rate of polishing and uniformity, higher rate of polishing can increase yield per unit time, but it is subjected to accelerating the phenomenon of metal dishing and erosion; while inferior uniformity needs more polishing time to completely remove copper, thus more serious phenomenon of metal dishing and erosion is induced. Thereby, for eliminating the phenomenon of metal dishing and erosion, we must start from improvement of the rate of polishing and uniformity.

For the purpose of taking care of both the yield per unit time and preventing the phenomenon of metal dishing and erosion, normally the process of copper-chemical mechanical polish is divided into two steps. In the first stage, larger removal rate is used to remove bulk overburden copper to increase the yield per unit time. In the second stage, smaller removal rate is used to remove the remaining less copper, in order to avoid over erosion phenomenon on the copper in the trenches. Generally, the two stages of the copper polishing processes require changing the polishing composition, to meet the requirements of copper polishing for different stages. However, changing the polishing composition not only is not benefit to simplification of the processes, but also is probable to increase waste material.

U.S. Pat. No. 6,679,929 discloses a polishing composition which includes at least a kind of polishing abrasive with a aliphatic carboxylic acid having 10 carbon atoms, an alkali ingredient, an accelerating compound, an anticorrosive agent, hydrogen peroxide and water; although the polishing composition can lower the rate of etching of copper metal, removing rate of the bulk copper makes disadvantageous affect. A published document of U.S. patent no. 2004/0020135 discloses a polishing composition containing silicon dioxide, an oxidant, amino acid, triazole-based compound and copper metal polishing composition of water. The patent does not disclose using of a co-inhibitor that can slow down the rate of etching of the polishing composition on metal under the condition of maintaining a high polish removing rate; meantime that is applicable to the two stages of the copper polishing.

Therefore, it still needs to provide a chemical mechanical polishing composition with a high removing ability through polishing to effectively eliminate the phenomenon of metal dishing and erosion.

SUMMARY OF THE INVENTION

The primary object of the present invention is to provide a chemical mechanical polishing composition with a high removal rate through polishing.

Another object of the present invention is to provide a chemical mechanical polishing composition that can effectively inhibit static etch rate.

Another object of the present invention is to provide a chemical mechanical polishing composition that is applicable to two stages of copper polishing.

To obtain the above objects, the present invention provides a chemical mechanical polishing composition; the polishing composition includes polishing abrasive, an oxidizing agent, an accelerating compound, an inhibitor, a co-inhibitor, and a solvent as the remaining. The composition can maintain a high removal rate through polishing, meantime it has a feature to inhibit static etch rate and lower the defect of polishing including metal dishing and erosion. Hence it needs no change of the composition for simultaneously removing a most part of a metal layer, particularly for a first stage of polishing bulk copper layer and for a second fine polishing stage of removing the remaining less copper; the present invention has the advantage of simplifying processing.

The present invention will be apparent after reading the detailed description of the preferred embodiment thereof in reference to the accompanying tables.

DETAILED DESCRIPTION OF THE PREFERRED EMBODIMENT

The present invention provides a chemical mechanical polishing composition, the polishing composition includes polishing abrasive, an oxidizing agent, an accelerating compound, an inhibitor, a co-inhibitor, and the remaining is a solvent.

In an embodiment, the polishing abrasives are chosen from (but is not limited to) fumed silica, colloidal silica formed by hydrolysis of sodium silicate or potassium silicate or hydrolysis-and-condensation of silane, precipitated or fumed aluminum oxide, precipitated or fumed titanium dioxide, high molecular material, and hybrid of metallic oxide and high molecular material. In which colloidal silica is preferred. If amount of the polishing abrasive used is overly low, this is disadvantageous to polishing, and the expected removal rate by polishing can not be reached to; on the other hand, if amount of the polishing abrasive used is overly high, the effect of mechanical polishing will be augmented, this will increase the removal rate of barrier layers and insulation layers, and is subjected to generate polishing defects by surface erosion. In an embodiment of the present invention, the colloidal silica is in the amount of 0.01 to 30% by weight of the gross weight of the composition, and preferably is in the amount of 0.1 to 15% by weight.

For the chemical mechanical polishing composition for polishing a copper layer, it is preferred to use hydrogen peroxide as an oxidizing agent. Generally, the oxidizing agent is in the amount of 0.25 to 5% by weight of the gross weight of the composition, and preferably is in the amount of 0.1 to 1.5% by weight.

The accelerating compound used in the embodiment of chemical mechanical polishing composition of the present invention includes (but is not limited to) citric acid, oxalic acid, tartaric acid, histidine, alanine or glycine. The accelerating compound is used to promote dissolution of the metal to be polished such as copper. To increase the amount of the accelerating compound in the polishing composition can help to increase the removal rate by polishing of a metal layer; this is applicable to polishing metal layer in a first stage. However, to increase the amount of the accelerating compound in the polishing composition can also increase the static etch rate in the mean time; this is disadvantageous to a fine-polishing process in a second stage. In this embodiment, the amount of the accelerating compound is in the amount of 0.01 to 5% by weight of the gross weight of the composition, preferably is in the amount of 0.1 to 3% by weight, and more preferably is in the amount of 0.3 to 2% by weigh.

In the chemical mechanical polishing composition of the present invention, an inhibitor and a co-inhibitor are used to effectively inhibit static etch rate under the condition of a high polish removal rate, this is applicable to the polishing processes in the first and the second stages. In this embodiment, the inhibitors include (but are not limited to) imidazoline-based compounds, triazole-based compounds and their derivates such as 1,2,4-triazole, 3-amino-1,2,4-triazole, 3-nitro-1,2,4-triazole, 3-amino-1H-1,2,4-triazole-5-carboxylic acid, 1H-benzotriazole or 5-methyl-1,2,3-benzotriazole. Generally, the inhibitor is in the amount of 0.001 to 1% by weight of the gross weight of the composition, preferably is in the amount of 0.005 to 0.8% by weight, and more preferably is in the amount of 0.01 to 0.5% by weigh.

The present invention uses amine carboxylate or its salt as a co-inhibitor, for instance, it uses sarcosine or its salt as a co-inhibitor. In this embodiment, the sarcosine and its salt include (but are not limited to) N-acyl sarcosine, lauroyl sarcosine, cocoyl sarcosine, oleoyl sarcosine, stearoyl sarcosine, and myristoyl sarcosine or its salt of lithium, sodium, potassium or amine etc. Generally, the co-inhibitor is in the amount of 0.001 to 1% by weight of the gross weight of the composition, preferably is in the amount of 0.005 to 0.5% by weight, and more preferably is in the amount of 0.01 to 0.1% by weigh.

The composition of the present invention can take water as a solvent, preferably takes deionized water as a solvent of the polishing composition.

The followings are specific embodiments for further explaining the features and functions of the present invention, but they are not used to limit the scope of the present invention.

Embodiment

EXAMPLES 1-8 FOR CONTRAST

According to table 1 below, silicon dioxide sol (colloidal silica) polishing abrasive each with about 62 nm mean particle size, alanine, hydrogen peroxide, an inhibitor (purchased from BASF, it is amine carboxylate with a commercial name of MAFO 13 MOD 1, imidazoline with a commercial name of DeLube C25T, sodium cocoyl sarcosinate and 1,2,4-triazole etc.) and water as a solvent are used in a polishing slurry composition for testing and contrast.

TABLE 1

|  | Contrast example | | | | | | | |
|---|---|---|---|---|---|---|---|---|
|  | 1 | 2 | 3 | 4 | 5 | 6 | 7 | 8 |
| Amine carboxylate (wt %) | 0.010 | 0.015 | 0.020 | — | — | — | — | — |
| Imidazoline (wt %) | — | — | — | 0.010 | 0.015 | 0.020 | — | — |
| Sodium cocoyl sarcosinate (wt %) | — | — | — | — | — | — | 0.006 | — |
| 1,2,4-triazole (wt %) | — | — | — | — | — | — | — | 0.020 |
| Colloidal silica (wt %) | 0.1 | 0.1 | 0.1 | 0.1 | 0.1 | 0.1 | 0.1 | 0.1 |
| Alanine (wt %) | 0.8 | 0.8 | 0.8 | 0.8 | 0.8 | 0.8 | 0.8 | 0.8 |
| Hydrogen peroxide (wt %) | 1.0 | 1.0 | 1.0 | 1.0 | 1.0 | 1.0 | 1.0 | 1.0 |

A test of polishing is conducted according to the following conditions:
Polishing machine: SpeedFam-IPEC 472 (Pheonix, Ariz.)
Wafer type: 8" blanket copper wafer (wafernet Co.)
Down force: 2.8 psig
Table speed: 150 rpm
Carrier speed: 30 rpm
Pad: IC1000 (Rohm and Haas)
Flow rate of the slurry: 200 ml/min The etching test takes 1"×1" copper wafer chip and immerses it in the polishing slurry, and places it on a 40° C. hot plate for 5 min with stirring, a 4 point probe (Resmap, IDE Inc.) is used to measure the thickness of the film before and after the test, in order to decide the static etch rate (SER).

The static etch rate (SER), the average value of the removal rate (RR) and the average value of the within-wafer-non-uniformity (WIWNU) are recorded in Table 2.

TABLE 2

|  | SER (A/min @ 40° C.) | Cu RR (A/min) | WIWNU (%) | RR/SER |
|---|---|---|---|---|
| Contrast example 1 | 883.9 | 3269 | 12.4 | 3.7 |
| Contrast example 2 | 966.9 | 3075 | 9.80 | 3.2 |
| Contrast example 3 | 835.9 | 3015 | 8.90 | 3.6 |
| Contrast example 4 | 14.6 | 2950 | 6.50 | 202.6 |
| Contrast example 5 | 27.8 | 2876 | 5.60 | 103.4 |
| Contrast example 6 | 29.2 | 2665 | 11.30 | 91.2 |
| Contrast example 7 | 7.80 | 2475 | 5.30 | 318.5 |
| Contrast example 8 | 217.8 | 3393 | 11.20 | 15.6 |

According to Table 2, we can see that using sodium cocoyl sarcosinate as an inhibitor will largely lower Cu removal rate (RR) during reducing the static etch rate of copper, this is unfavorable to the process of the first stage.

Embodiments 1-3

According to table 3 below, silicon dioxide sol (colloidal silica) polishing abrasive each with about 62 nm mean particle size, glycine, hydrogen peroxide, 1,2,4-triazole inhibitor, a co-inhibitor (purchased from BASF, it is amine carboxylate with a commercial name of MAFO 13 MOD 1) and water as a solvent are used in a polishing slurry composition for testing and contrast.

TABLE 3

|  | Embodiment | | |
|---|---|---|---|
|  | 1 | 2 | 3 |
| Amine carboxylate (wt %) | 0.010 | 0.015 | 0.020 |
| 1,2,4-triazole (wt %) | 0.02 | 0.02 | 0.02 |
| Colloidal silica (wt %) | 0.1 | 0.1 | 0.1 |
| Glycine (wt %) | 0.4 | 0.4 | 0.4 |
| Hydrogen peroxide (wt %) | 1.0 | 1.0 | 1.0 |

A test of polishing is conducted according to the following conditions:
Polishing machine: SpeedFam-IPEC 472 (Pheonix, Ariz.)
Wafer type: 8" blanket copper wafer (wafernet Co.)
Down force: 2.8 psig
Table speed: 150 rpm
Carrier speed: 30 rpm
Pad: IC 1000 (Rohm and Haas)
Flow rate of the slurry: 200 ml/min The etching test takes 1"×1" copper wafer chip and immerses it in the polishing slurry, and places it on a 40° C. hot plate for 5 min with stirring, a 4 point probe (Resmap, IDE Inc.) is used to measure the thickness of the film before and after the test, in order to decide the static etch rate (SER).

The static etch rate (SER), the average value of the removal rate (RR) and the average value of the within-wafer-non-uniformity (WIWNU) are recorded in Table 4.

TABLE 4

|  | SER (A/min @ 40° C.) | Cu RR (A/min) | WIWNU (%) | RR/SER |
|---|---|---|---|---|
| Embodiment 1 | 117.5 | 3010 | 15.2 | 25.6 |
| Embodiment 2 | 45.0 | 3107 | 15.2 | 69.0 |
| Embodiment 3 | 30.4 | 3082 | 19.4 | 101.4 |

According to Table 4, we can see that using a co-inhibitor can effectively inhibit the static etch rate of copper under the condition of maintaining a high polish removal rate of copper, and increase RR/SER value.

EXAMPLES 1-2 FOR CONTRAST

Embodiments 4-5

According to table 5 below, in the Examples 1-2 for contrast, colloidal silica polishing abrasive each with about 62 nm mean particle size, glycine, hydrogen peroxide, a triazole inhibitor and water as a solvent are used in a polishing slurry composition sample. The embodiments 4-5 further use sodium sarcosinate co-inhibitors as ingredients of a polishing slurry composition for testing and contrast.

TABLE 5

|  | Contrast example | | Embodiment | |
|---|---|---|---|---|
|  | 1 | 2 | 4 | 5 |
| Triazole (wt %) | 0.02 | 0.04 | 0.02 | 0.04 |
| Sodium Sarcosinate (wt %) | — | — | 0.1 | 0.2 |
| Colloidal silica (wt %) | 0.1 | 0.2 | 0.1 | 0.2 |
| Glycine (wt %) | 0.4 | 0.8 | 0.4 | 0.8 |
| Hydrogen peroxide (wt %) | 0.7 | 1.4 | 0.7 | 1.4 |

A test of polishing is conducted according to the following conditions:
Polishing machine: SpeedFam-IPEC 472
Wafer type: 8" blanket copper wafer
Down force: 3.5 psig
Table speed: 150 rpm
Carrier speed: 30 rpm
Pad: IC 1000 (Rohm and Haas)
Flow rate of the slurry: 150 ml/min The etching test takes 1"×1" copper wafer chip and immerses it in the polishing slurry, and places it on a 40° C. hot plate for 5 min with stirring, a 4 point probe (Resmap, IDE Inc.) is used to measure the thickness of the film before and after the test, in order to decide the static etch rate (SER).

The static etch rate (SER), the average value of the removal rate (RR) and the average value of the within-wafer-non-uniformity (WIWNU) are recorded in Table 6.

TABLE 6

|  | SER (A/min @ 40° C.) | Cu RR (A/min) | WIWNU (%) | RR/SER |
|---|---|---|---|---|
| Contrast example 1 | 256.2 | 4663 | 14.99 | 18.2 |
| Contrast example 2 | 337.9 | 6317 | 23.17 | 18.7 |
| Embodiment 4 | 7.6 | 4368 | 9.51 | 574.7 |
| Embodiment 5 | 10.7 | 6178 | 15.49 | 577.4 |

According to Table 6, we can see that using a co-inhibitor can effectively inhibit the static etch rate of copper under the condition of not influencing Cu removal rate (RR), and increase RR/SER value.

Embodiments 6-7

According to table 7 below, colloidal silica polishing abrasive each with about 62 nm mean particle size, glycine, hydrogen peroxide, a 3-anino-1,2,4-triazole or 1,2,4-triazole inhibitor and sodium sarcosinate co-inhibitors are used in a polishing slurry composition sample for testing and contrast.

TABLE 7

|  | Embodiment 6 | Embodiment 7 |
|---|---|---|
| 3-anino-1,2,4-triazole (wt %) | 0.2 | — |
| 1,2,4-triazole (wt %) | — | 0.2 |
| Sodium sarcosinate (wt %) | 0.1 | 0.1 |
| Colloidal silica (wt %) | 0.1 | 0.1 |
| Glycine (wt %) | 0.4 | 0.4 |
| Hydrogen peroxide (wt %) | 0.7 | 0.7 |

A test of polishing is conducted according to the following conditions:
Polishing machine: SpeedFam-IPEC 472 (Pheonix, Ariz.)
Wafer type: 8" blanket copper wafer
Down force: 2.8 psig Table speed: 150 rpm
Carrier speed: 30 rpm
Pad: IC 1000 (Rohm and Haas)
Flow rate of the slurry: 200 ml/min The average value of the removal rate (RR) and the average value of the within-wafer-non-uniformity (WIWNU) are recorded in Table 8.

TABLE 8

|  | Cu RR (A/min) | WIWNU (%) |
|---|---|---|
| Embodiment 6 | 4765 | 4.6 |
| Embodiment 7 | 4958 | 5.5 |

According to Table 8, we can see that triazole and its derivates all have substantial effects.

Embodiments 8-12

According to table 9 below, colloidal silica polishing abrasive each with about 62 nm mean particle size, glycine, hydrogen peroxide, a triazole inhibitor, a co-inhibitor (purchased from BASF, it is amine carboxylate with a commercial name of MAFO 13 MOD 1, or is sarcosinate) and water as a solvent are used in a polishing slurry composition sample for testing and contrast.

TABLE 9

|  | Embodiment | | | | |
|---|---|---|---|---|---|
|  | 8 | 9 | 10 | 11 | 12 |
| Triazole (wt %) | 0.300 | 0.018 | 0.020 | 0.300 | 0.030 |
| Sarcosinate (wt %) | — | 0.01 | 0.01 | 0.1 | 0.1 |
| MAFO 13MOD 1 (wt %) | 0.03 | — | — | — | — |
| Colloidal silica (wt %) | 1.0 | 0.1 | 0.1 | 0.1 | 0.1 |
| Glycine (wt %) | 1.8 | 1.3 | 0.4 | 1.3 | 0.4 |
| Hydrogen peroxide (wt %) | 0.8 | 0.8 | 0.8 | 0.8 | 0.8 |

A test of polishing is conducted according to the following conditions: (the resulted average value of the removal rate (RR) is recorded in table 10)
Polishing machine: SpeedFam-IPEC 472 (Pheonix, Ariz.)
Wafer type: 8" blanket copper wafer
Down force: 1 or 2 psig
Table speed: 150 rpm
Carrier speed: 30 rpm
Pad: IC 1000 (Rohm and Haas)
Flow rate of the slurry: 150 ml/min

TABLE 10

|  | Cu RR (A/min) (2 psig) | Cu RR (A/min) (1 psig) |
|---|---|---|
| Embodiment 8 | 5028 | 2254 |
| Embodiment 9 | 13093 | 7300 |
| Embodiment 10 | 5319 | 3401 |
| Embodiment 11 | 6088 | 2914 |
| Embodiment 12 | 5457 | 3543 |

According to Table 10, we can see that using the polishing composition of the present invention can remove bulk copper under the condition of applying to the first stage copper polishing with down force 2 psig for polishing. On the other hand, same polishing composition is used under the condition of applying to the second stage copper fine-polishing with down force 1 psig for polishing, advantage of no necessity of changing polishing slurry can be provided.

Embodiment 13

According to table 11 below, colloidal silica polishing abrasive each with about 62 nm mean particle size, glycine, hydrogen peroxide, a triazole inhibitor, a co-inhibitor sarcosine salt and water as a solvent are used in a polishing slurry composition sample for testing and contrast.

TABLE 11

|  | Embodiment 13 |
|---|---|
| Triazole (wt %) | 0.02 |
| sarcosine salt (wt %) | 0.01 |
| Colloidal silica (wt %) | 0.1 |
| Glycine (wt %) | 1.3 |
| Hydrogen peroxide (wt %) | 0.8 |

A test of polishing is conducted according to the following conditions: the results of removal rate (RR) of blanket copper, tantalum and tetraethylortho silicate (TEOS) and 100×100 μm dishing as well as erosion are recorded in table 12.
Polishing machine: Mirra Mesa polisher (Applied Materials)
Wafer type: 200 mm MIT854 pattern wafer (Ramco); 8 inch blanket wafer of copper, tantalum (Ramco)
Membrane pressure: 4.5 psig
Head speed: 57 rpm
Carrier speed: 63 rpm
Pad: IC 1010 (Rohm and Haas)
Flow rate of the slurry: 150 ml/min

TABLE 12

|  | Cu RR (A/min) | Cu WIWNU (%) | Ta RR (A/min) | TEOS RR (A/min) | Dishing (A) |
|---|---|---|---|---|---|
| Embodiment 13 | 7000 | 3% | 7 | 0 | 410 |

According to Table 12, we can see that using the polishing slurry of the present invention can get the result of planarization only with a single polishing step without changing polishing slurry.

The embodiment given is only for illustrating the principle and effect of the present invention, and not for giving any limitation to the scope of the present invention. It will be apparent to those skilled in this art that various modifications or changes can be done without departing from the spirit and scope of this invention. Accordingly all such modifications and changes shall fall within the scope of the appended claims and are intended to form part of this invention.

The invention claimed is:

1. A chemical mechanical polishing composition, said polishing composition comprises: (A) polishing abrasive, (B) an oxidizing agent, (C) an accelerating compound, (D) an inhibitor, (E) a co-inhibitor, and (F) a solvent as a remaining part, wherein said co-inhibitor is in an amount of 0.001 to 1% by weight of a gross weight of said polishing composition and is sarcosine or its salt, and said inhibitor is chosen from imidazoline-based compounds and triazole-based compounds and is in an amount of 0.001 to 1% by weight of the gross weight of said polishing composition.

2. The chemical mechanical polishing composition as claimed in claim 1, wherein said polishing abrasives are chosen from fumed silica, colloidal silica formed by hydrolysis of sodium silicate or potassium silicate or hydrolysis-andcondensation of silane, precipitated or fumed aluminum oxide, precipitated or fumed titanium dioxide, high molecular material, and hybrid of metallic oxide and high molecular material.

3. The chemical mechanical polishing composition as claimed in claim 1, wherein said polishing abrasives are colloidal silica.

4. The chemical mechanical polishing composition as claimed in claim 2, wherein said colloidal silica is in an amount of 0.01 to 30% by weight of the gross weight of said polishing composition.

5. The chemical mechanical polishing composition as claimed in claim 1, wherein said oxidizing agent is hydrogen peroxide.

6. The chemical mechanical polishing composition as claimed in claim 1, wherein said oxidizing agent is in an amount of 0.25 to 5% by weight of the gross weight of said polishing composition.

7. The chemical mechanical polishing composition as claimed in claim 1, wherein said accelerating compound is chosen from citric acid, oxalic acid, tartaric acid, histidine, alanine and glycine.

8. The chemical mechanical polishing composition as claimed in claim 1, wherein said accelerating compound is in an amount of 0.01 to 5% by weight of the gross weight of said polishing composition.

9. The chemical mechanical polishing composition as claimed in claim 1, wherein said triazole-based compound is chosen from 1,2,4-triazole, 3-amino-1,2,4-triazole, 3-nitro-1,2,4-triazole, 3-amino-1H-1,2,4-triazole-5-carboxylic acid, 1H-benzotriazole and 5-methyl-1,2,3-benzotriazole.

10. The chemical mechanical polishing composition as claimed in claim 1, wherein said sarcosine or its salt is chosen from N-acyl sarcosine, lauroyl sarcosine, cocoyl sarcosine, oleoyl sarcosine, stearoyl sarcosine, and myristoyl sarcosine or its salt.

11. The chemical mechanical polishing composition as claimed in claim 1, wherein said solvent is water.

12. The chemical mechanical polishing composition as claimed in claim 3, wherein said colloidal silica is in an amount of 0.01 to 30% by weight of the gross weight of said polishing composition.

* * * * *